United States Patent [19]
Tobita

[11] Patent Number: 5,815,446
[45] Date of Patent: Sep. 29, 1998

[54] POTENTIAL GENERATION CIRCUIT

[75] Inventor: Youichi Tobita, Tokyo, Japan

[73] Assignee: Mitsubishi Denki Kabushiki Kaisha, Tokyo, Japan

[21] Appl. No.: 763,120

[22] Filed: Dec. 10, 1996

[30] Foreign Application Priority Data

Dec. 11, 1995 [JP] Japan .................................. 7-321760

[51] Int. Cl.$^6$ .................................................. G11C 11/40
[52] U.S. Cl. ...................... 365/189.09; 365/226; 327/534
[58] Field of Search .......................... 365/189.09, 149, 365/226; 327/534–535, 537

[56] References Cited

U.S. PATENT DOCUMENTS

| | | | |
|---|---|---|---|
| Re. 34,290 | 6/1993 | Tobita | 323/313 |
| 3,805,095 | 4/1974 | Lee et al. | 327/543 |
| 4,559,548 | 12/1985 | Iizuka et al. | 257/299 |
| 4,692,689 | 9/1987 | Takemae | 323/313 |
| 4,698,789 | 10/1987 | Iizuka | 365/226 |
| 5,394,365 | 2/1995 | Tsukikawa | 327/537 |
| 5,489,870 | 2/1996 | Arakawa | 327/537 |
| 5,644,266 | 7/1997 | Chen | 327/534 |

FOREIGN PATENT DOCUMENTS

| | | |
|---|---|---|
| 57-157315 | 2/1982 | Japan . |
| 62-85669 | 4/1987 | Japan . |

*Primary Examiner*—A. Zarabia
*Attorney, Agent, or Firm*—McDermott, Will & Emery

[57] ABSTRACT

A potential generating circuit includes at least a pair of MOS transistors each of which is diode-connected and series connected between an output node and a given potential node and disposed in same forward direction. Each MOS transistor has its back gate and a gate interconnected. A capacitor is coupled between a connection node of the pair of MOS transistors and an input node to which an alternating signal is inputted.

8 Claims, 10 Drawing Sheets

POTENTIAL GENERATION CIRCUIT

TECHNICAL FIELD

The present invention relates to a semiconductor integrated circuit and, more particularly, to a semiconductor integrated circuit bearing a novel potential generation circuit utilizing the threshold voltage of a diode-connected MOS transistor.

BACKGROUND ART

These days, under the background of the wide and rapid spread of portable equipment such as notebook-type personal computers, cellular phones, personal handy phones, etc., there is an increasing demand for semiconductor integrated circuits having low power consumption. As a method for achieving low power consumption, it has been common to operate a semiconductor integrated circuit with a power source of low voltage. When driving a semiconductor integrated circuit with a low voltage power source, however, there arises a disadvantage that the ratio of a voltage drop brought by the threshold voltage of MOS transistor to a source potential is large, and it becomes difficult to achieve a potential adjustment utilizing a voltage drop brought by the threshold voltage of MOS transistor, which seriously affects circuit design.

FIG. 14 is a circuit diagram of a conventional substrate potential generation circuit (hereinafter referred to as $V_{BB}$ generation circuit) described in U.S. Pat. No. 4,559,548, for example.

In FIG. 14, a reference potential node "a" is connected to a ground potential $V_{SS}$; and an output node "b" is a terminal for generating a substrate potential $V_{BB}$ which is lower than the ground potential $V_{SS}$. Between the output node "b" and the reference potential node "a", diode-connected P-channel MOS transistors "p1" and "p2" are connected in series so as to be disposed in same forward direction, and the back gate of the MOS transistors "p1" and "p2" are connected to a source potential $V_{CC}$. Numeral "q" indicates a connection node between the two diode-connected P-channel MOS transistors "p1" and "p2", and is connected to an input node "d" through a capacitor "c". An input signal ϕ which is an alternating current signal is applied to the input node "d".

Operation of this conventional $V_{BB}$ generation circuit of above arrangement is hereinafter described. When the input signal ϕ has reached the $V_{CC}$ level, the potential of the connection node "q" of the two diode-connected P-channel MOS transistors rises due to capacitive coupling of the capacitor "c". At this moment, a forward bias is applied only to the P-channel MOS transistor "P1" connected to the ground node "a" of the two diode-connected P-channel MOS transistors "p1" and "p2", whereby only the P-channel MOS transistor "P1" becomes conductive, and the potential of the connection node "q" lowers. Then, when the input signal ϕ has come to the $V_{SS}$ level, the potential of the connection node "q" drops further due to capacitive coupling of the capacitor "c". As a result, a forward bias is applied only to the P-channel MOS transistor "P2" connected to the output node "b" of the two diode-connected P-channel MOS transistors "p1" and "p2", whereby only the P-channel MOS transistor "P2" becomes conductive, the electric charge is drawn from the output node "b", and the potential of the output node "b" is lowered. By repeating the mentioned operation, the substrate potential $V_{BB}$ which is lower than the ground potential $V_{SS}$ is generated from the output node "b". Generally, the circuit for performing such an operation is called a charge pump circuit. An expression for calculating the potential generated in the $V_{BB}$ generation circuit shown in FIG. 14 is $-(V_{CC}-2|V_{th}|)$, when establishing the threshold value of the two diode-connected P-channel MOS transistors "p1" and "p2" both to be an equal value $V_{th}$. Since $V_{CC}$=3.3 V and the threshold voltage $|V_{th}|$ of the MOS transistors is usually 0.7 V or so, with a low voltage power source, the value of $V_{BB}$ in the $V_{BB}$ generation circuit is −1.9 V, which is only 58% of the source potential in terms of absolute value. In the circuit utilizing the threshold voltage $|V_{th}|$ of the MOS transistor driven by the low voltage power source, the voltage drop of the MOS transistor occupies a significant percentage in the source voltage.

This type of problem is produced in the Vpp generation circuit 230 shown in FIG. 15 described in U.S. Pat. No. 3,805,095, for example, as well which operates with substantially the same function as the $V_{BB}$ generation circuit, but generating a boosting potential $V_{PP}$ which is higher than the source potential $V_{CC}$.

DISCLOSURE OF THE INVENTION

In the conventional potential generation circuits such as the $V_{BB}$ generation circuit and $V_{PP}$ generation circuit above described, therefore, a problem exists in that the percentage of the threshold voltage $|V_{th}|$ of the MOS transistor with respect to the source voltage $V_{CC}$ is large particularly at the time of operation with a low voltage power source. Hence, performance of the charge pump circuit is very poor.

The present invention was made to solve the above-discussed problem and an object of the invention is to provide a potential generation circuit of high performance with respect to source voltage, particularly in operation with a low voltage power source.

Another object of the invention is to provide a substrate potential generation circuit capable of rapidly generating a predetermined potential.

According to a general aspect of the invention, provided is a potential generation circuit including two MOS transistors each being diode-connected and connected in series between an output node and a source potential node so as to be disposed in the same forward direction and of which respective back gates and gates thereof are interconnected. A capacitor is connected between a connection node of the two transistors and an input node to which alternating current signal is applied.

BRIEF DESCRIPTION OF DRAWINGS

In all figures, like elements are given the same numbers.

BEST MODE FOR CARRYING OUT THE INVENTION

Figure 1:
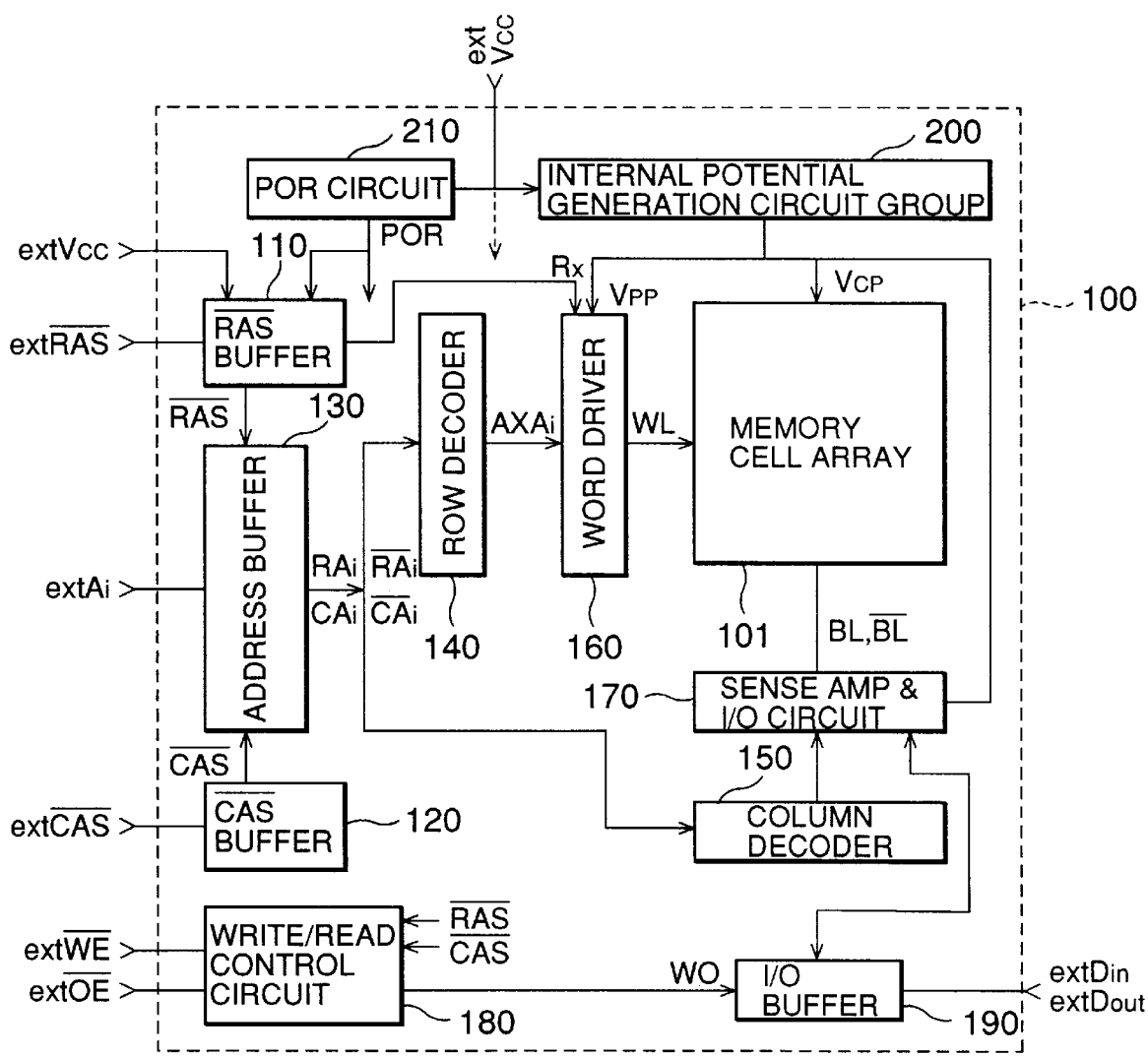
FIG. 1 is a block diagram of DRAM in which the present invention is applied.

FIG. 1 shows a block diagram of the DRAM (Dynamic Random Access Memory) 100 in which the invention is applied, including an internal potential generation circuit group 200, a POR circuit 210 and a memory cell array 101 comprised of a plurality of memory cells arranged in a plurality of rows and columns. A /RAS(Row Address Strobe) buffer 110 receives an external /RAS signal applied from outside and outputs /RAS signal to an address buffer 130; and a /CAS (Column Address Strobe) buffer 120 receives an external /CAS signal applied from outside and outputs a /CAS signal to the address buffer 130. The address buffer 130 receives an external address signal ext Ai (i=0, 1, 2, , ,) and the /RAS signal, latches the external address signal ext Ai, outputs row address signals RAi and /RAi for the internal circuit, and receives the external address signal ext Ai (i=0, 1, 2, , ,) and the /CAS signal, latches the external address signal ext Ai, and outputs column address signals CAi and /CAi for the internal circuit.

A row decoder numeral 140 receives the row address signals RAi and /RAi from the address buffer 130 and selects a corresponding word line. A column decoder 150 receives the CAi and /CAi signals from the address buffer 130 and selects a corresponding sense amplifier and I/O circuit 170 which amplifies a potential of a memory cell 101 read out on a bit line, and transfers data of the memory cell 101 read out on the bit line. Numeral 160 designates a word driver for boosting a potential of the word line selected by the row decoder 140. 180 designates a write and read control circuit which receives a write enable signal ext/WE and an output enable signal ext/OE applied from outside, and outputs a signal WO for controlling read and write of the internal circuit. 190 designates an I/O buffer which receives the signal WO from the write and read control circuit 180, transfers data ext Din applied from outside to the sense amplifier and I/O circuit 170 through a data line in case of write, and outputs data read out from the memory cell through the sense amplifier and I/O circuit 170 and the data line to the I/O pin as data ext Dout in case of readout.

Figure 2:
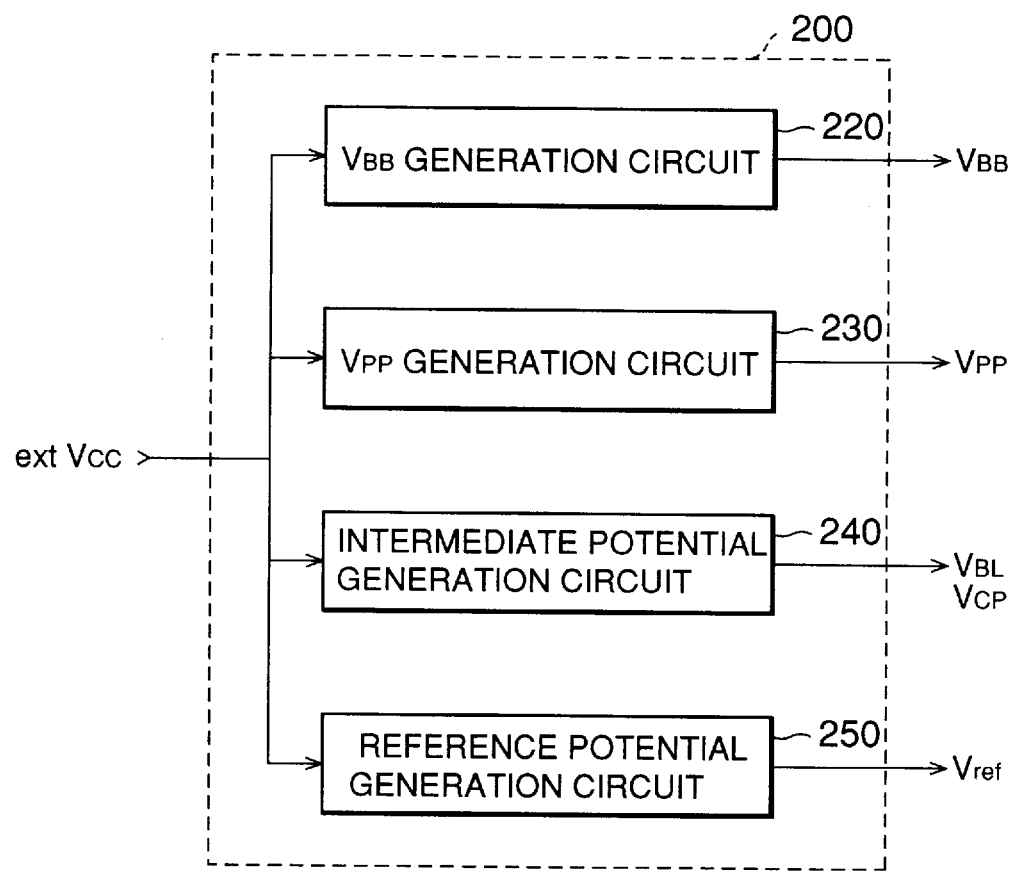
FIG. 2 is a block diagram showing an example of an internal potential generation circuit group shown in FIG. 1.

FIG. 2 is a block diagram of the internal potential generation circuit group 200 shown in FIG. 1, which comprises a $V_{BB}$ generation circuit 220 for generating a substrate potential $V_{BB}$ lower than the ground potential $V_{SS}$, a $V_{PP}$ generation circuit 230 for generating a boosting potential $V_{PP}$ higher than $V_{CC}$, an intermediate potential generation circuit 240 for generating an intermediate potential $½V_{CC}$ serving as a cell plate potential VCP and a bit line pre-charge potential $V_{BL}$, and a reference potential generation circuit 250 for generating a reference voltage $V_{ref}$.

Figure 4:
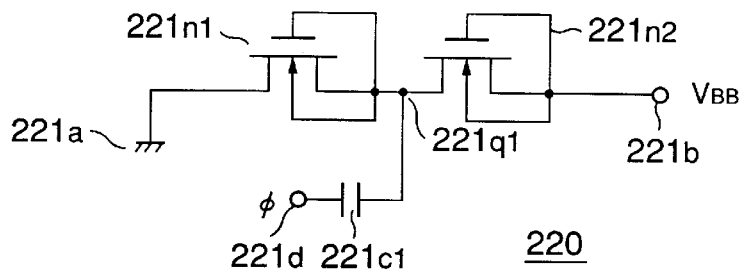
FIG. 4 is a circuit diagram showing a $V_{BB}$ generation circuit according to an embodiment of the invention.
Figure 8:
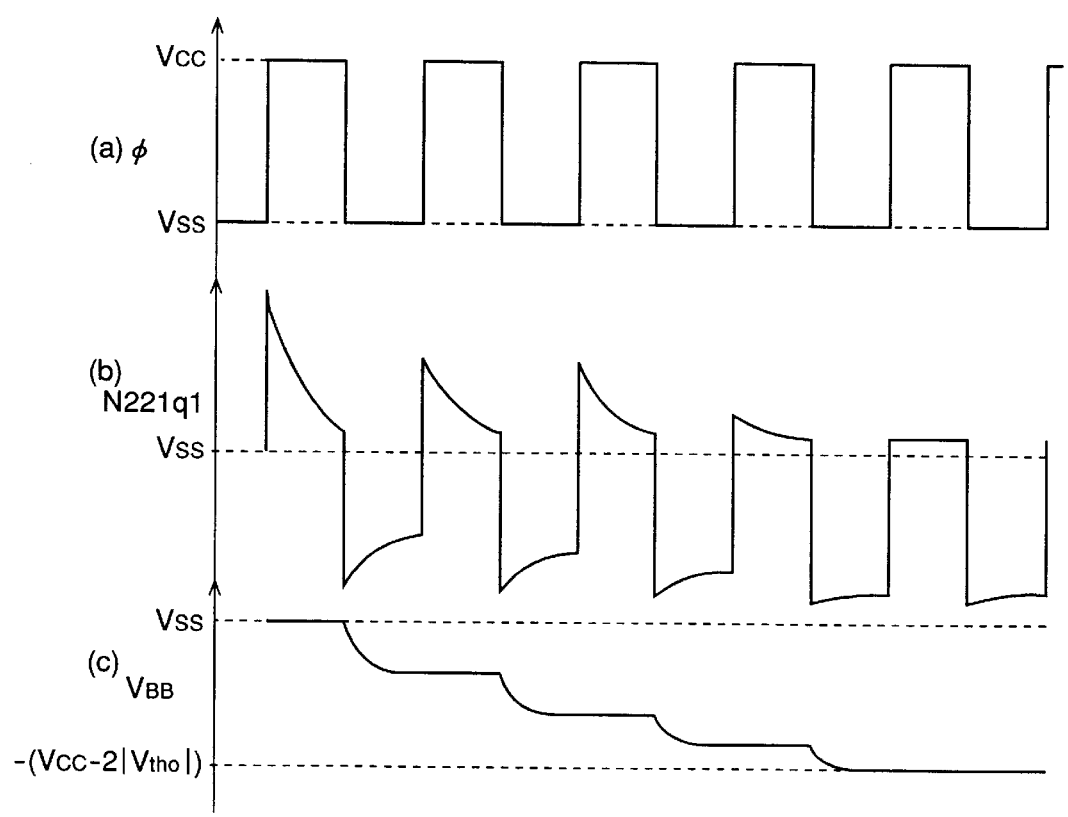
FIG. 8 is a timing chart showing operation of the $V_{BB}$ generation circuit according to the invention.

FIG. 4 is a circuit diagram of the $V_{BB}$ generation circuit 220 showing a preferred embodiment of this invention, and FIG. 8 is a timing chart showing operation thereof. In FIG. 4, reference numeral 221a designates a reference potential node to which in this case a ground potential $V_{SS}$ is applied. Numeral 221b designates an output node for outputting the substrate potential $V_{BB}$. Numerals 221n1 and 221n2 designate N-channel MOS transistors, each being diode-connected, between the output node 221b and the ground potential node 221a so as to be disposed in forward direction from the output node 221b to the ground potential node 221a, and in which respective back gates are connected to their own gates. Numeral 221q1 is a connection node of the two diode-connected N-channel MOS transistors 221n1 and 221n2; and 221d is an input node for receiving an input signal ϕ, which is an alternating current signal. 221c1 designates a capacitor connected between the input node 221d and the node 221q1.

Figure 3:
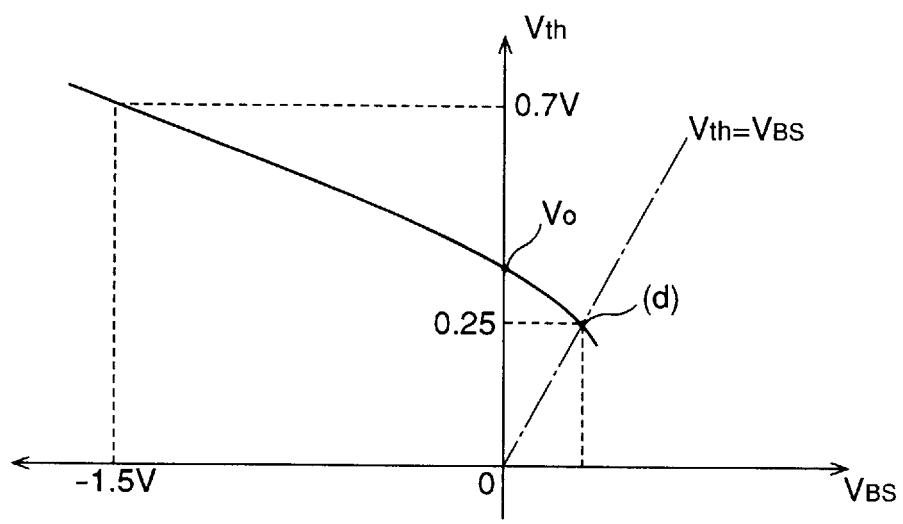
FIG. 3 is a graph showing a characteristic of threshold voltage of a MOS transistor with respect to the voltage between back gate and source according to the invention.

The threshold voltage of a MOS transistor in which its back gate is connected to its gate is hereinafter described with reference to FIG. 3. FIG. 3 is a graph showing schematically a fluctuation in the threshold voltage $V_{th}$ of the MOS transistor with respect to a potential difference $V_{BS}$ between the back gate and source of the MOS transistor, and the potential difference is shown in the following expression (1).

$$V_{th}=V_0+K[(2\phi_F+V_{BS})^{1/2}-(2\phi_F)^{1/2}] \tag{1}$$

where: $V_{BS}$ indicates a back gate voltage (on the basis of source voltage), K indicates a body effect constant, and $\phi_F$ indicates a surface potential, and $V_0$ indicates a threshold voltage when $V_{BS}$=0 V.

In the graph of FIG. 3, (d) indicates a point at which the potential difference $V_{BS}$ between the back gate and source of the MOS transistor is equal to the threshold voltage $V_{th}$ of the MOS transistor. As is explicit from FIG. 3, as a result of $V_{BS}$=$V_{th}$, it becomes possible to reduce its threshold voltage from 0.7 V in case of the conventional $V_{BS}$=−1.5 V to 0.25 V, which is smaller than the threshold voltage 0.35 V of the MOS transistor in case of $V_{BS}$=0 V by 0.1 V, because $V_{BS}$ becomes equal to $V_{th}$. This $V_{BS}$=$V_{th}$ may be obtained by interconnecting the back gate and the gate in the MOS transistor. In the description given hereinafter, for the sake of distinction, $|V_{th}0|$ indicates an absolute value of the threshold voltage of the MOS transistor at the moment of connecting the back gate and the gate, while $|V_{th}|$ indicates the conventional threshold voltage of $V_{BS0}$=−1.5 V.

Operation of the $V_{BB}$ generation circuit shown in FIG. 4 is now described with reference to the timing chart of FIG. 8. In FIG. 8, (a) indicates a change in the potential of the input signal ϕ, (b) indicates a change in the potential N221q1 of the connection node 221q1, and (c) indicates a change in the potential $V_{BB}$ of the output node 221b of the $V_{BB}$ generation circuit shown in FIG. 4.

First, when the input signal ϕ comes up from the $V_{SS}$ level to the $V_{CC}$ level, the potential N221q1 of the connection node 221q1 rises from the $V_{SS}$ level to the $V_{CC}$ level due to capacitive coupling of the capacitor 221c1. At this moment, of the two diode-connected N-channel MOS transistors 221n1 and 221n2, only the N-channel MOS transistors 221n1 connected to the ground potential node 221a is biased in forward direction, and only this N-channel MOS transistors 221n1 is conductive, whereby the potential N221q1 of the connection node 221q1 drops from the $V_{CC}$ level. Then, when the input signal φ comes down from the $V_{CC}$ level to the $V_{SS}$ level, and the potential N221q1 of the connection node 221q1 drops further from the potential once lowered due to capacitive coupling of the capacitor 221c1. As a result, now, of the two diode-connected N-channel MOS transistors 221n1 and 221n2, only the N-channel MOS transistors 221n2 connected to the output node 221b is biased in forward direction, and only this N-channel MOS transistor 221n2 is conductive, whereby electric charge is drawn out of the output node 221b, and the potential $V_{BB}$ of the output node 221b drops. By repeating these operations, the substrate potential $V_{BB}$ at a potential lower than the ground potential $V_{SS}$ is generated.

Calculated value of the potential generated in the $V_{BB}$ generation circuit shown in FIG. 4 is $-(V_{CC}-2|V_{th0}|)$ when absolute values of the threshold voltage of the two diode-connected N-channel MOS transistors 221n1 and 221n2 are equalized to be $|V_{th}|$, and the potential $V_{BB}$ of the output node 221b is stabilized at this value of $-(V_{CC}-2V_{th0}|)$ as shown in the timing chart of FIG. 8. In the low voltage power source, $V_{CC}$=3.3 V and the threshold voltage $|V_{th}|$ of the MOS transistors is about 0.25 V as shown in the graph of FIG. 3, and therefore $V_{BB}$ in the $V_{BB}$ generation circuit shown in FIG. 4 is −2.8 V, thus a mounting to 85% of the source potential in absolute value.

Figure 5:
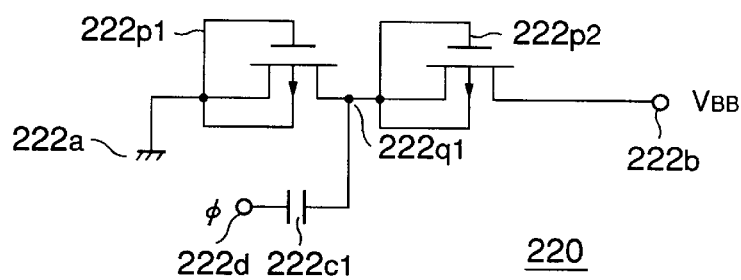
FIG. 5 is a circuit diagram showing a $V_{BB}$ generation circuit according to another embodiment of the invention.

FIG. 5 shows another $V_{BB}$ generation circuit comprised of P-channel MOS transistors 221p1 and 221p2, instead of the N-channel MOS transistors 221n1 and 221n2 forming the $V_{BB}$ generation circuit shown in FIG. 4. Supposing that absolute values of the threshold voltages of the N-channel MOS transistors 221n1, 221n2 and the P-channel MOS transistors 221p, 221p2 are equally $|V_{th0}|$, a calculated value of the potential generated in the $V_{BB}$ generation circuit shown in FIG. 5 is also $-(V_{CC}-2|V_{th0}|)=-2.8$ V in the same manner as that of the $V_{BB}$ generation circuit shown in FIG. 4.

Figure 6:
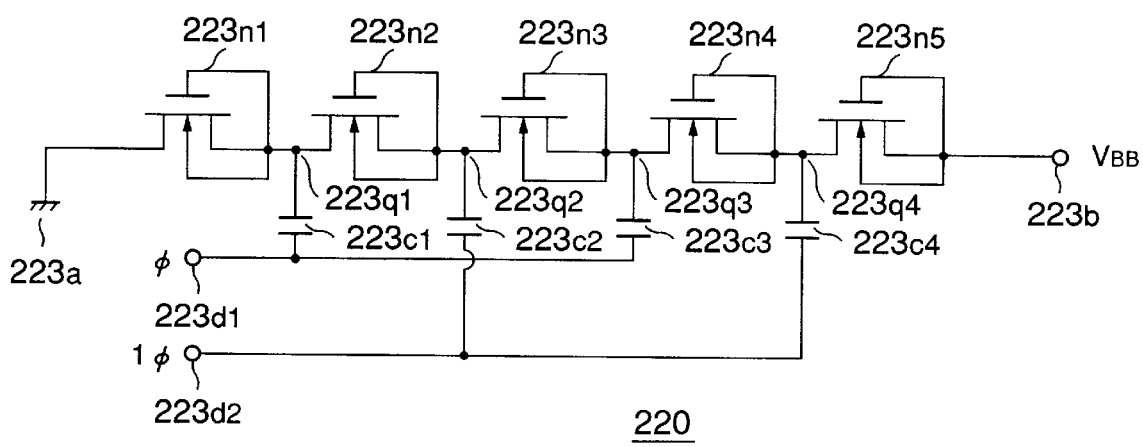
FIG. 6 is a circuit diagram showing a further modified example of the $V_{BB}$ generation circuit according to the invention.
Figure 14:
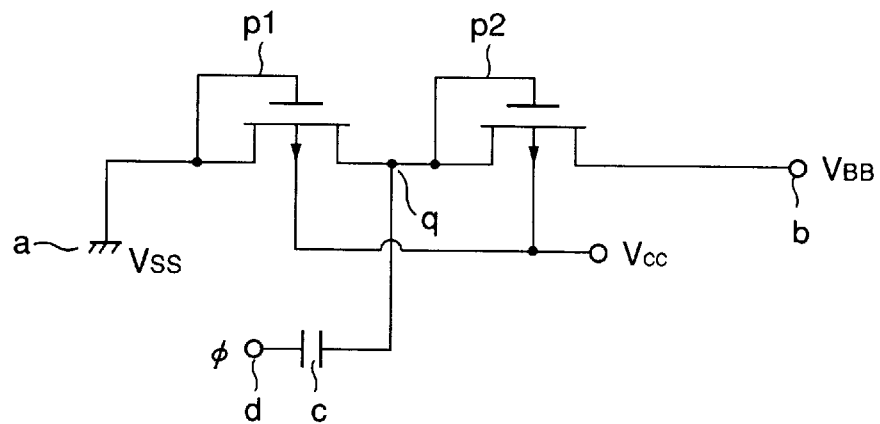
FIG. 14 is a circuit diagram showing a $V_{BB}$ generation circuit according to the prior art.
Figure 15:
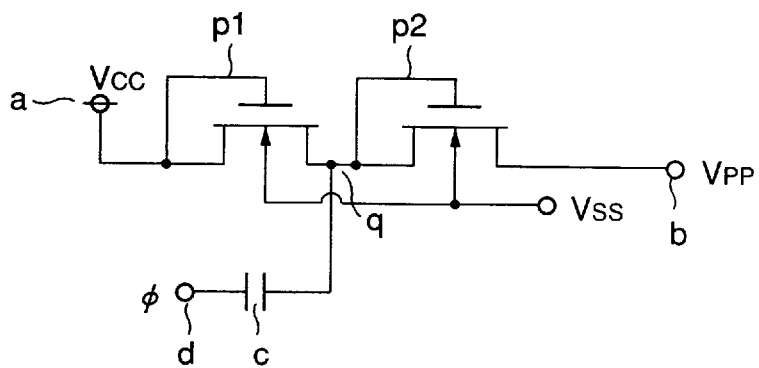
FIG. 15 is a circuit diagram showing a $V_{PP}$ generation circuit according to the prior art.

FIG. 6 shows a further $V_{BB}$ generation circuit comprised of a multiple stages of N-channel MOS transistors and capacitors shown in FIG. 4. More specifically, this $V_{BB}$ generation circuit is comprised of five N-channel MOS transistors and four capacitors. In FIG. 6, reference numerals 223n1, 223n2, 223n3, 223n4 and 223n5 designate respectively diode connected N-channel MOS transistors in which their back gates and gates are interconnected. Numerals 223c1, 223c2, 223c3 and 223c4 designate capacitors; numerals 223q1, 223q2, 223q3 and 223q4 designate connection nodes between respective N-channel MOS transistors; and numeral 223d1 designates a first input node for receiving a first alternating circuit input signal φ. Numeral 223d2 designates a second node for receiving a second input signal/φ with the inversion signal of a first input signal φ. A calculated value of the potential generated in the $V_{BB}$ generation circuit shown in FIG. 14 is $-(4\ V_{CC}-5|V_{th0}|)=-12.05$ V.

Figure 7:
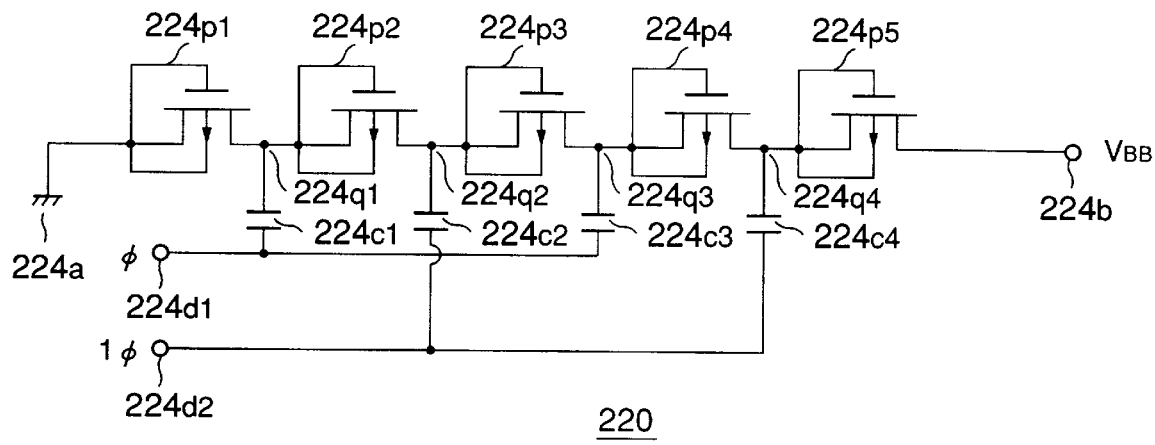
FIG. 7 is a circuit diagram showing a still further example of the $V_{BB}$ generation circuit according to the invention.

FIG. 7 shows a further $V_{BB}$ generation circuit comprised of P-channel MOS transistors 224p1, 223p2, 224p3, 224p4 and 224p5, instead of the N-channel MOS transistors 224n1, 223n2, 224n3, 224n4 and 224n5 forming the $V_{BB}$ generation circuit shown in FIG. 6. Supposing that absolute values of the N-channel MOS transistors 224n1, 223n2, 224n3, 224n4 and 224n5 and the P-channel MOS transistors 224p1, 223p2, 224p3, 224p4 and 224p5 are equally $|V_{th0}|$, a calculated value of the potential generated in the $V_{BB}$ generation circuit shown in FIG. 7 is also $-(4\ V_{CC}-5|V_{th0}|)=-12.05$ V in the same manner as that of the $V_{BB}$ generation circuit shown in FIG. 6.

Figure 9:
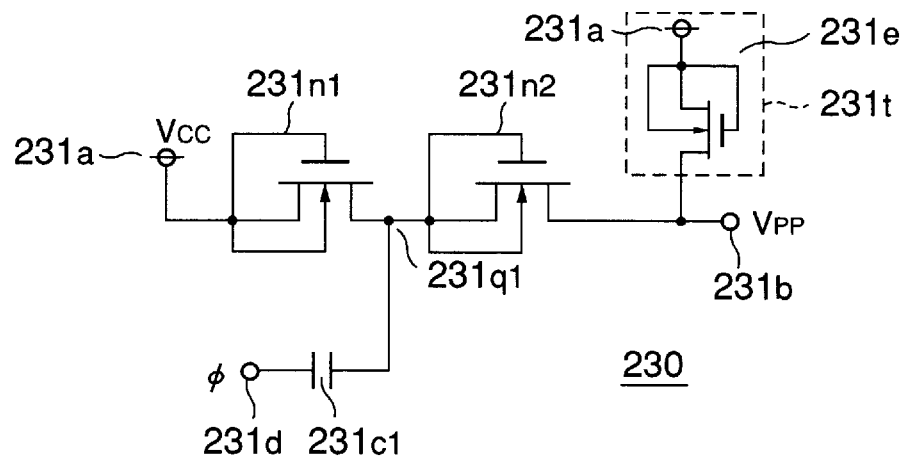
FIG. 9 is a circuit diagram showing a $V_{PP}$ generation circuit according to an embodiment of the invention.

Next, the $V_{PP}$ generation circuit 230 according to the second mode of the invention is described with reference to FIGS. 9 to 12. In FIG. 9, reference numeral 231a designates a source potential node to which source potential $V_{CC}$ is applied; numeral 231b designates an output node for outputting the boosting potential $V_{PP}$; and numerals 231n1 and 231n2 designate N-channel MOS transistors which, each being diode-connected, are connected between the output node 231b and the source potential node 231a so as to be disposed in forward direction from the source potential node 231a to the output node 231b, and in which back gates are connected to gates. Numeral 231q1 designates a connection node of the two diode-connected N-channel MOS transistors 231n1 and 231n2. Numeral 231d designates an input node for receiving an alternating circuit input signal φ. Numeral 231c1 designates a capacitor connected between the input node 231d and the connection node 231q1; and numeral 231t designates a charging circuit disposed for advance charging of the output node 231b to reach a potential of $V_{CC}-|V_{th0}|$ thereby rapidly boosting the potential of the output node 231b, and having a diode-connected N-channel MOS transistor whose back gate and a gate are interconnected, and which is connected between the source potential node 231a and the output node 231b so as to be disposed in forward direction from the source potential node 231a to the output node 231b.

Figure 13:
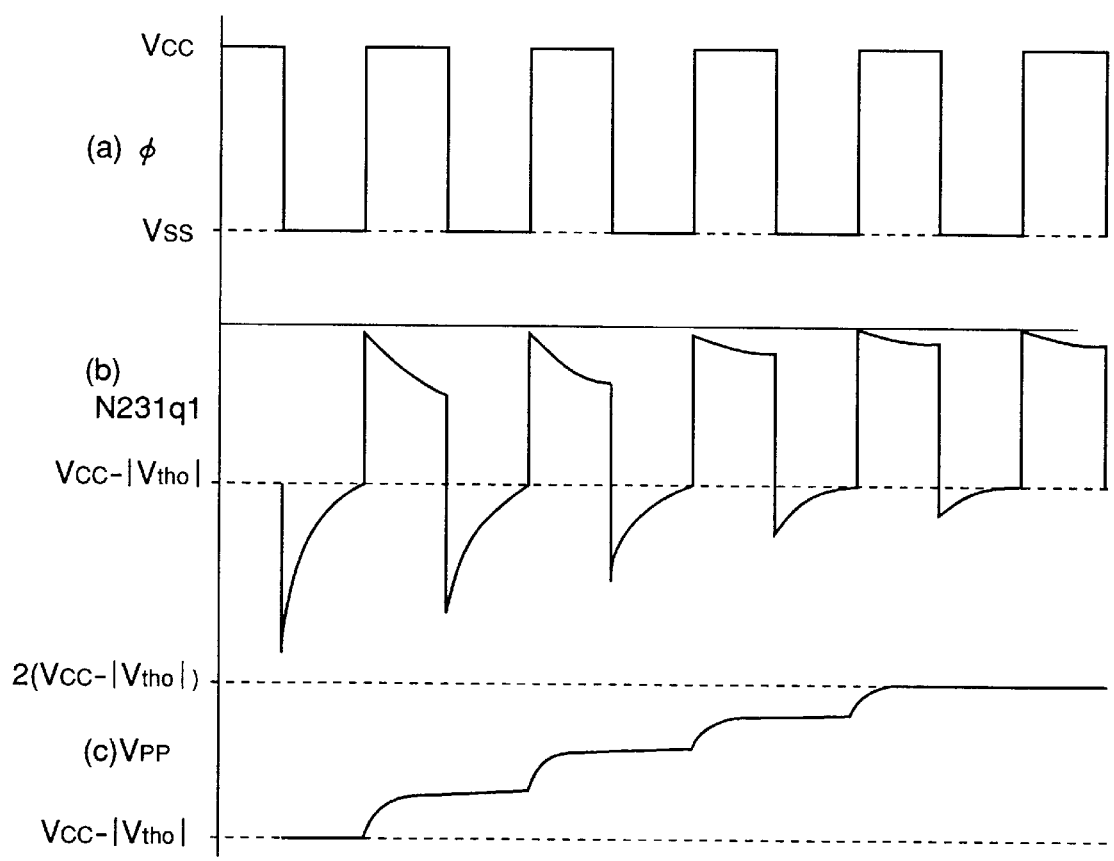
FIG. 13 is a timing chart showing operation of the $V_{PP}$ generation circuit according to the invention.

Operation of the $V_{PP}$ generation circuit shown in FIG. 9 is now described with reference to a timing chart of FIG. 13. In FIG. 13, (a) indicates a change in the input signal φ, (b) indicates a change in the potential N231q1 of the node 231q1, and (c) indicates a change in the potential $V_{PP}$ of the output node 231b.

First, when the input signal φ is changed from the $V_{CC}$ level to the $V_{SS}$ level, the potential N231q1 of the connection node 231q1 drops from the $V_{CC}-|V_{th0}|$ level due to capacitive coupling of the capacitor 231c1. At this moment, of the two diode-connected N-channel MOS transistors 231n1 and 231n2, only the N-channel MOS transistors 231n1 connected to the ground potential node 231a is biased in forward direction, and only this N-channel MOS transistors 231n1 is conductive, whereby the potential N231q1 of the connection node 231q1 rises. S Then, when the input signal φ changes from the $V_{SS}$ level to the $V_{CC}$ level, the potential N231q1 of the connection node 231q1 rises further due to capacitive coupling of the capacitor 231c1. As a result of the two diode-connected N-channel MOS transistors 231n1 and 231n2, only the N-channel MOS transistors 231n2 connected to the output node 231b is biased in forward direction, and only this N-channel MOS transistors 231n2 is conductive, whereby the potential $V_{PP}$ of the output node further rises from the potential $V_{CC}-|V_{th0}|$ applied by the charging circuit 231t. By repeating these operations, the boosting potential $V_{PP}$ of a potential higher than the source potential $V_{CC}$ is generated.

Calculated value of the potential generated in the $V_{PP}$ generation circuit shown in FIG. 9 is $2(V_{CC}-|V_{th0}|)$ when the threshold voltages of the two diode-connected N-channel MOS transistors are equalized at $|V_{th0}|$, and the potential $V_{PP}$ of the output node 231b is stabilized at this value of $2(V_{CC}-|V_{th0}|)$ as shown in the timing chart of FIG. 13. In the low voltage power source, $V_{CC}$=3.3 V and the threshold voltage $iV_{th}ol$ of the MOS transistors is about 0.25 V as shown in the graph of FIG. 3, and therefore $V_{PP}$ in the $V_{PP}$ generation circuit shown in FIG. 9 is 6.5 V.

Figure 10:
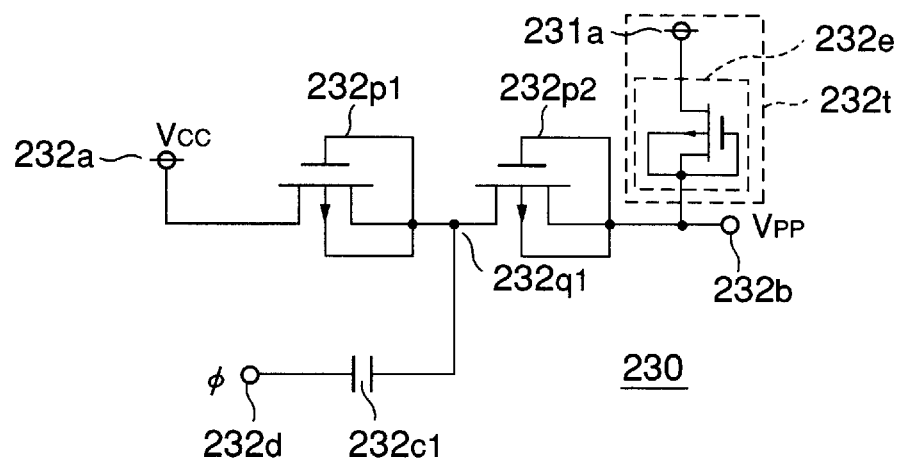
FIG. 10 is a circuit diagram showing a $V_{PP}$ generation circuit according to another embodiment of the invention.

FIG. 10 shows another $V_{PP}$ generation circuit comprised of P-channel MOS transistors 231p1 and 231p2, instead of the N-channel MOS transistors 231n1 and 231n2 forming the $V_{PP}$ generation circuit shown in FIG. 9. Supposing that threshold voltages of the N-channel MOS transistors 231n1, 231n2 and the P-channel MOS transistors 231p1, 231p2 are equally $|V_{th0}|$, a calculated value of the potential generated in the $V_{PP}$ generation circuit shown in FIG. 10 is also $2(V_{CC}-|V_{th0}|)=6.1$ V in the same manner as that of the $V_{PP}$ generation circuit shown in FIG. 9.

Figure 11:
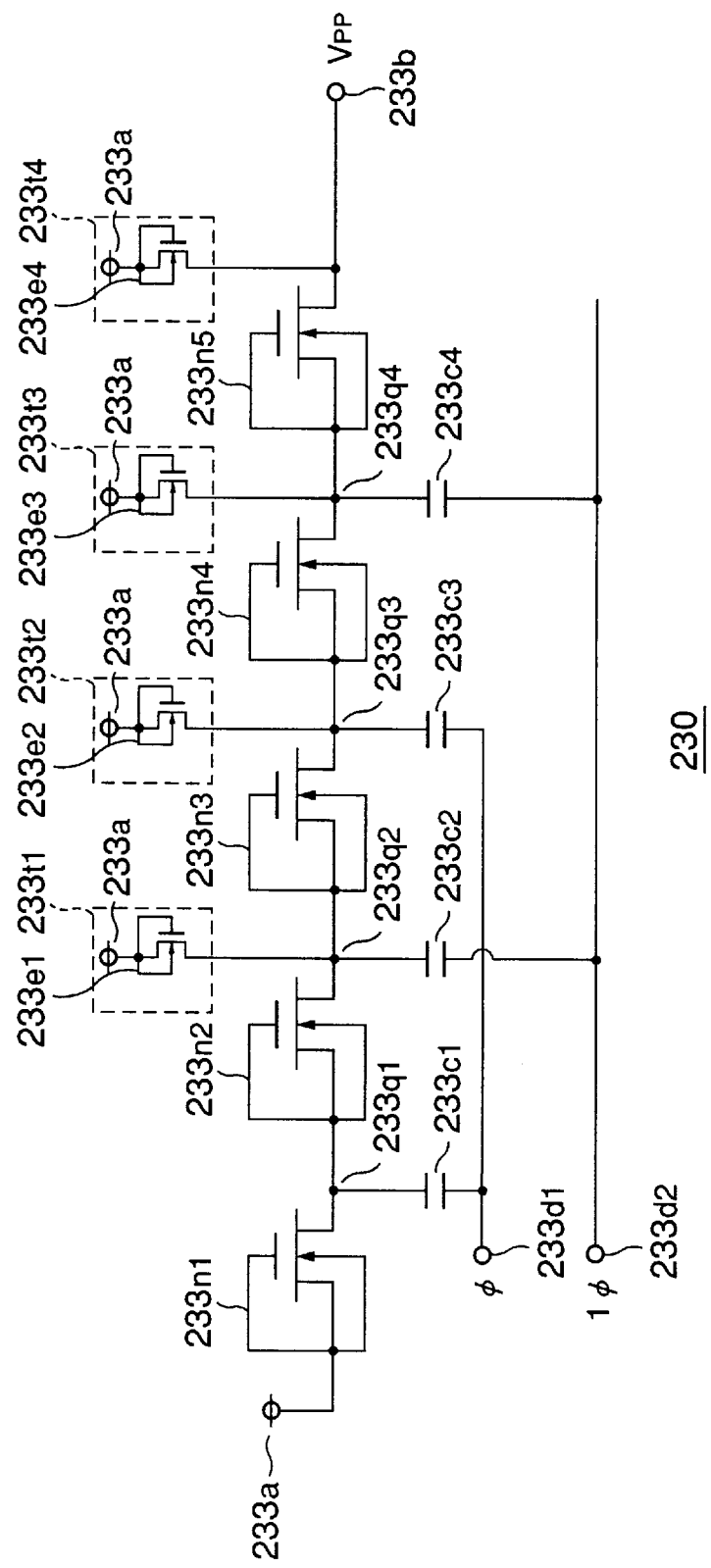
FIG. 11 is a circuit diagram showing a further modified example of the $V_{PP}$ generation circuit according to the invention.

FIG. 11 shows a further developed $V_{PP}$ generation circuit comprised of a multiple stages of N-channel MOS transistors and capacitors shown in FIG. 9. More specifically, this $V_{PP}$ generation circuit is comprised of five N-channel MOS transistors, four capacitors and four charging circuits. In FIG. 11, reference numerals 233n1, 233n2, 233n3, 233n4 and 233n5 designate respectively diode connected N-channel MOS transistors whose back gates and gates are interconnected. Numerals 233c1, 233c2, 233c3 and 23c4 designate capacitors; numerals 233q1, 233q2, 233q3 and 233q4 designate connection nodes between respective N-channel MOS transistors; and numeral 233d1 designates a first input node for receiving alternating current input signal φ. Numeral 233d2 designates a second input node for receiving a second inverted alternating current input signal /φ. Numeral 233t1, 233t2, 233t3 and 233t4 designate charging circuits disposed for charging the connection nodes 233q2, 233q3 and 233q4 and output node 233b to reach a potential of $V_{CC}-|V_{th0}|$ thereby rapidly boosting the potential of the output node 233b, and having diode-connected N-channel MOS transistors 233e1, 233e2, 233e3 and 233e4 each of whose back gate and a gate are interconnected, and which are connected among the source potential node 233a, respective connection nodes 233q2, 233q3, 233q4 and the output node 233b so as to be disposed in forward direction from the source potential node 233a to the respective connection nodes 233q2, 233q3, 233q4 and the output node 233b. A calculated value of the potential generated in the $V_{PP}$ generation circuit shown in FIG. 11 is $5(V_{CC}-|V_{th0}|)=15.25$ V.

Figure 12:
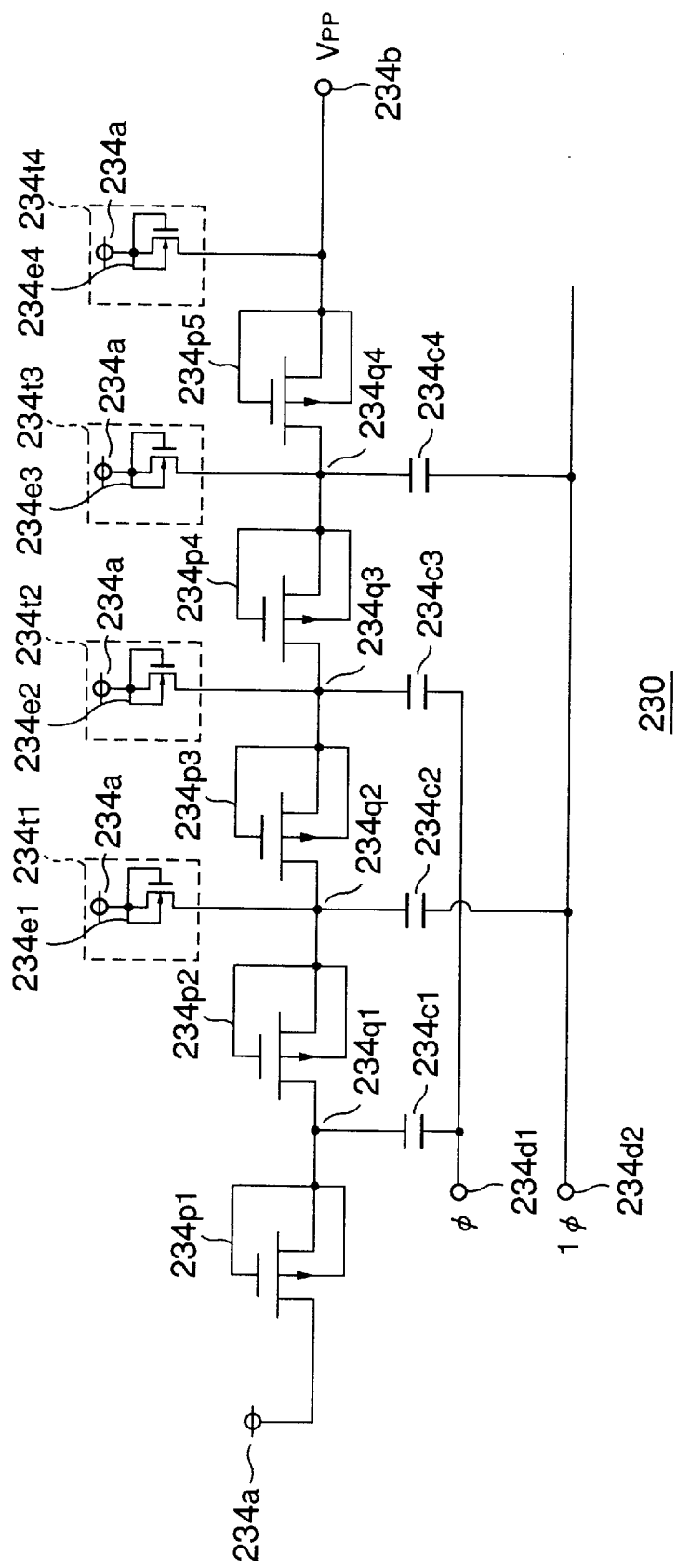
FIG. 12 is a circuit diagram showing a still further example of the $V_{BB}$ generation circuit according to the invention.

FIG. 12 shows another $V_{PP}$ generation circuit comprised of P-channel MOS transistors 234p1, 234p2, 234p3, 234p4, 234p5, 234e1, 234e2, 234e3 and 234e4 instead of the N-channel MOS transistors 233n1, 233n2, 233n3, 233n4, 233n5, 233e1, 233e2, 233e3 and 233e4 forming the $V_{PP}$ generation circuit shown in FIG. 11. Supposing that threshold voltages of the N-channel MOS transistors 233n1, 233n2, 233n3, 233n4, 233n5 and the P-channel MOS transistors 234p1, 234p2, 234p3, 234p4, 234p5 are equally $|V_{th0}|$, a calculated value of the potential generated in the $V_{PP}$ generation circuit shown in FIG. 12 is also $5(V_{CC}-|V_{th0}|)=15.25$ V in the same manner as that of the $V_{PP}$ generation circuit shown in FIG. 11.

In the potential generation circuit of above arrangement, since the threshold voltage of the MOS transistors is small, loss of the generated potential due to the drop of threshold voltage of the MOS transistors is also small, making it possible to obtain a potential generation circuit of superior performance with respect to the source voltage.

The invention has been described with respect to certain embodiments. Various modifications and additions within the spirit of the invention will occur to those of skill in the art. Accordingly, the scope of the invention is limited solely by the following claims.

I claim:

1. A potential generating circuit comprising:
at least a first and a second diode connected MOS transistor in series connected between an output node and a given potential node and disposed in the same forward direction, each having a respective back gate always interconnected to a respective gate thereof; and
a capacitor coupled between a connection node of said first and second MOS transistors and an input node to which an alternating signal is to be applied.

2. The potential generating circuit as set forth in claim 1, wherein said first and second MOS transistors are diode-connected and series connected between the output node and a ground potential node so as to be disposed in a forward direction from the output node to the ground potential node.

3. The potential generating circuit as set forth in claim 1, wherein said first and second MOS transistors are diode-connected and series connected between the output node and a source potential node so as to be disposed in a forward direction from the source potential node to the output node, aid further comprising a charging MOS transistor which is diode-connected between the source potential node and the output node and disposed in a forward direction from the source potential node to the output node, wherein the charging MOS transistor has its back gate and a gate interconnected.

4. A DRAM comprising a substrate bearing:
   (a) a memory cell array for storing charge,
   (b) row and column drivers for addressing the array to access selected cells of the array; and
   (c) a substrate potential generation circuit applying a prescribed potential to the substrate, comprising at least a first and a second diode-connected MOS transistor connected in series between an output node and a reference node, disposed in the same forward direction and each having a respective gate and a respective back gate always interconnected, capacitor coupled between a node interconnecting said first and second transistors and an input node.

5. A semiconductor memory device comprising:
   (a) a memory array including a plurality of memory cells arranged in rows and columns
   (b) a plurality of word lines arranged corresponding to said rows and each connecting memory cells on a corresponding row;
   (c) a drive signal generator for generating a drive signal, comprising at least a pair of insulated gate type field effect transistors connected in series between an output node outputting said drive signal and a reference node receiving a reference voltage, disposed in the same forward direction and each having a respective gate and a respective back gate thereof always interconnected, and a capacitor coupled between a node interconnecting said pair of field effect transistors and an input node receiving an alternating signal; and
   (d) a word driver for transferring the drive signal received from said drive signal generator onto a word line arranged corresponding to an addressed row among said rows.

6. The potential generating circuit as set forth in claim 1, wherein, said first diode connected MOS transistor has its back gate connected to its respective gate independent of a conduction state of the second diode connected MOS transistor connected in series.

7. The potential generating circuit as set forth in claim 4, wherein, said first diode connected MOS transistor has its back gate interconnected to its respective gate independent of a conduction state of the second diode connected MOS transistor connected in series.

8. A potential generating circuit comprising:
at least first and second diode connected MOS transistors connected in series between an output node and a given potential node and disposed in the same forward direction, each having a respective back gate interconnected to a respective gate thereof; and
a capacitor coupled between a connection node of said first and second MOS transistors and an input node to which an alternating signal is to be applied.

* * * * *